(12) United States Patent
Perner

(10) Patent No.: US 9,812,196 B2
(45) Date of Patent: Nov. 7, 2017

(54) GEOMETRY DEPENDENT VOLTAGE BIASES FOR ASYMMETRIC RESISTIVE MEMORIES

(71) Applicant: Hewlett Packard Enterprise Development LP, Houston, TX (US)

(72) Inventor: Frederick Perner, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/030,092

(22) PCT Filed: Oct. 28, 2013

(86) PCT No.: PCT/US2013/067071
§ 371 (c)(1),
(2) Date: Apr. 18, 2016

(87) PCT Pub. No.: WO2015/065316
PCT Pub. Date: May 7, 2015

(65) Prior Publication Data
US 2016/0247563 A1    Aug. 25, 2016

(51) Int. Cl.
G11C 13/00    (2006.01)
G11C 5/02    (2006.01)
G11C 5/14    (2006.01)

(52) U.S. Cl.
CPC .......... *G11C 13/004* (2013.01); *G11C 5/025* (2013.01); *G11C 5/147* (2013.01); *G11C 13/0023* (2013.01); *G11C 13/0069* (2013.01); *G11C 13/0007* (2013.01)

(58) Field of Classification Search
CPC ............ G11C 13/0069; G11C 13/0004; G11C 13/0007
USPC ......................................................... 365/148
See application file for complete search history.

(56) References Cited

U.S. PATENT DOCUMENTS

| | | |
|---|---|---|
| 7,177,181 B1 | 2/2007 | Scheuerlein |
| 2003/0022420 A1 | 1/2003 | Kleveland et al. |
| 2009/0238005 A1 | 9/2009 | You |
| 2011/0299340 A1 | 12/2011 | Samachisa et al. |
| 2012/0081964 A1 | 4/2012 | Li |

(Continued)

FOREIGN PATENT DOCUMENTS

| | | |
|---|---|---|
| EP | 1345232 A2 | 9/2003 |
| WO | WO-2011136795 A1 | 11/2011 |

OTHER PUBLICATIONS

International Searching Authority, The International Search Report and Written Opinion, dated Jul. 16, 2014, 11 Pages.

(Continued)

*Primary Examiner* — Jason Lappas
(74) *Attorney, Agent, or Firm* — Fabian VanCott

(57) ABSTRACT

In one example, a system includes a multi-plane memory array with shared crossbars and memory elements accessed through the shared crossbars and support circuitry. The support circuitry includes a bias multiplexer to determine an orientation of a target memory element in the multi-plane memory array and output voltage biases with a polarity based on the orientation of the target memory element. Methods for generating and applying geometry dependent voltage biases are also provided.

20 Claims, 6 Drawing Sheets

(56) References Cited

U.S. PATENT DOCUMENTS

| | | | |
|---|---|---|---|
| 2012/0099367 A1* | 4/2012 | Azuma | G11C 13/0007 365/148 |
| 2012/0182804 A1 | 7/2012 | Hung et al. | |
| 2012/0230108 A1 | 9/2012 | Missiroli et al. | |

OTHER PUBLICATIONS

Ou, E. et al., Array Architecture for a Nonvolatile 3-Dimensional Cross-Point Memory, Mar. 2010, 119 Pages.

* cited by examiner

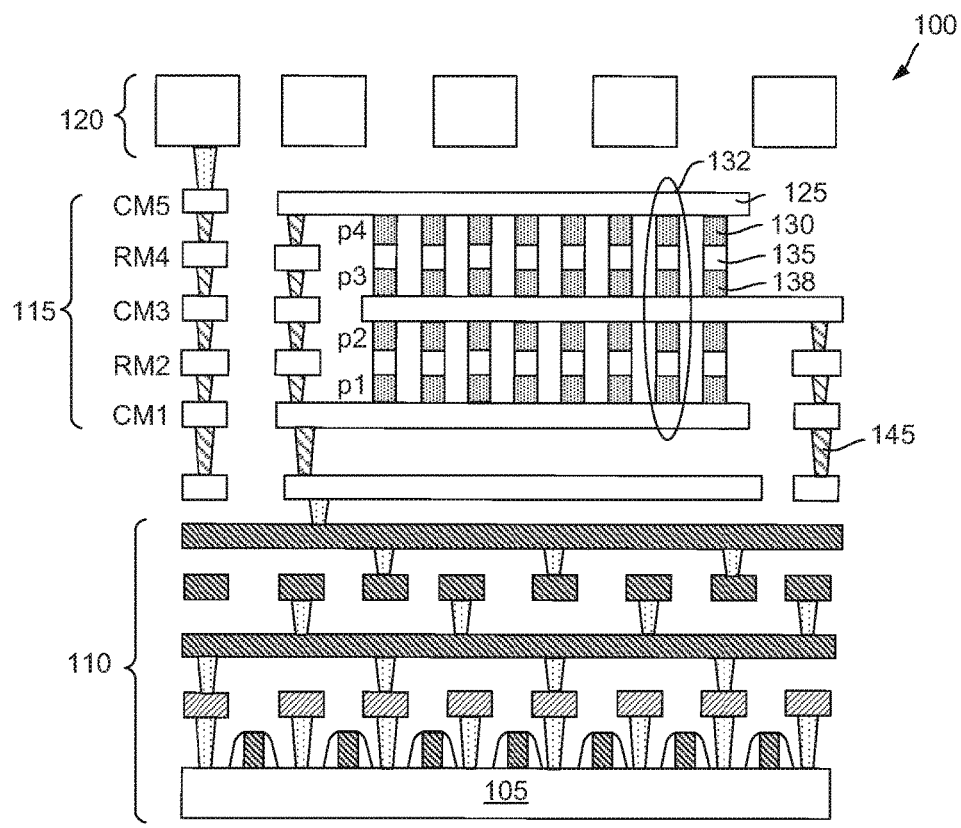
Fig. 1A
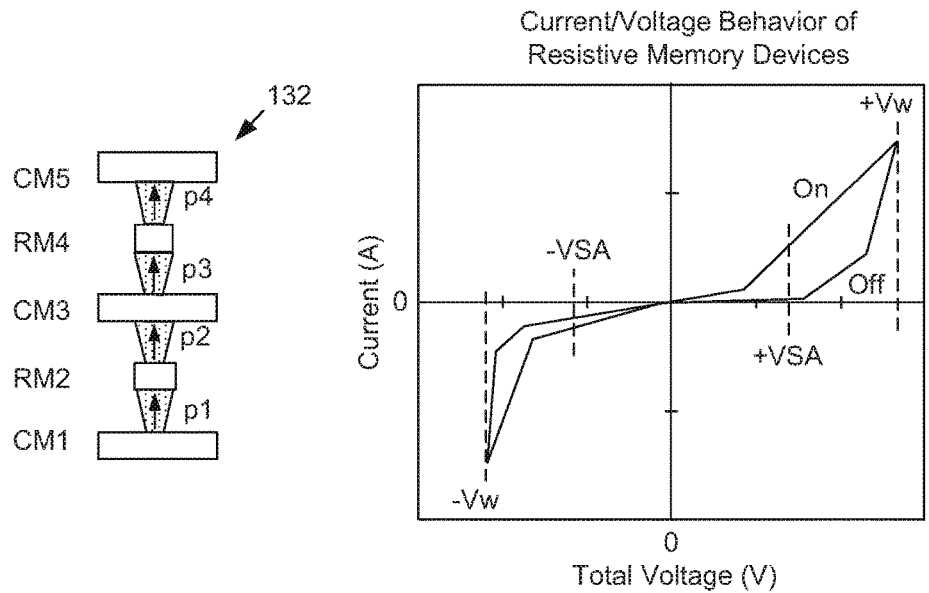
Fig. 1B  Fig. 1C

GEOMETRY DEPENDENT VOLTAGE BIASES FOR ASYMMETRIC RESISTIVE MEMORIES

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

BRIEF DESCRIPTION OF THE DRAWINGS

The accompanying drawings illustrate various examples of the principles described herein and are a part of the specification. The illustrated examples are merely examples and do not limit the scope of the claims.

FIG. 1A is a cross sectional diagram of a three dimensional resistive memory architecture, according to one example of principles described herein.

FIG. 1B shows a stack of asymmetric resistive memory elements sandwiched in between shared crossbars, according to one example of principles described herein.

FIG. 1C is a graph showing an asymmetric characteristic of the resistive memory elements, according to one example of principles described herein.

Throughout the drawings, identical reference numbers designate similar, but not necessarily identical, elements.

DETAILED DESCRIPTION

Figure 2:
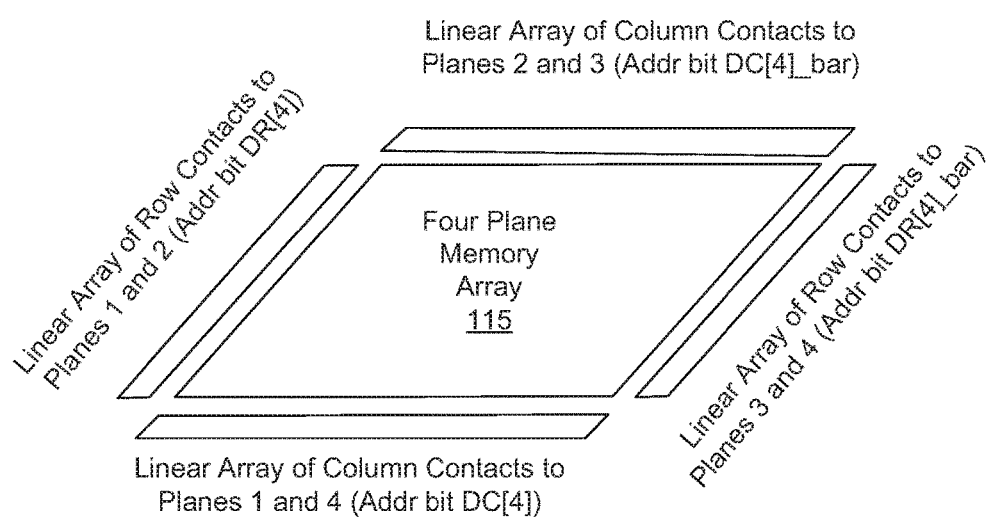
FIG. 2 is a diagram of a multi-plane resistive memory array with perimeter contacts, according to one example of principles described herein.

Multi-plane, resistive cross-point memories may benefit from custom read and write bias voltages for each plane of memory elements. A cost effective, multi-plane memory generally features shared conductors connecting memory elements to the wiring plane below one plane of the memory elements and to the wiring plane above another plane of memory elements. Read and write currents need to flow both in an upward direction and a downward direction, i.e., in a bipolar manner.

Up to this point, it has been assumed the memristor I-V characteristics of memristor devices are symmetrical, uniform, and independent of the multi-plane process history. However, research by the inventors shows that the I-V characteristics of the memristor memory element will not be symmetrical and that different bias voltages will be beneficial for operating the memristor memory element in a bipolar manner. Further, the processing sequence for a multi-plane memory will cause the various planes of memristor memory elements to experience different process histories. These process differences may yield plane dependent I-V characteristics. Process dependent I-V characteristics and asymmetric I-V characteristics are expected to reduce the read and write margins of multi-plane memristor memories.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

The principles described below show practical systems and methods to apply the appropriate analog biases to selected memristor memory elements in a multi plane memory structure. The principles address how to sense the direction of a bipolar memory element and how to apply the appropriate bias to this element. In a multi-plane memory the direction of the memory element and the process history can determine the analog biases used for optimum read and write operations. Knowledge of the plane number and direction of the memory element can be determined from the incoming memory address and used to steer the appropriate analog bias voltages to the selected memory element.

The principles also address differences in the characteristics of resistive memory elements in a multi-plane memory that result from the process history of the multi-plane memory. For example, memory elements in the bottom planes will have been deposited before the memory elements in the upper layers. Consequently, the memory elements in the bottom layers will have been subjected to more processing time/temperature than the memory elements in the upper layer. Thus, the performance of memory elements may be dependent on the process history and may demonstrate significant asymmetrical behavior that will affect the read and write margins. The principles describe below provide methods and systems to sense the location of the memory element in a multi-plane memory stack and apply the appropriate analog biases for optimum read and write operations, FIG. 1A is a cross sectional diagram of a portion of a three dimensional resistive memory architecture (100) for use in a data storage device. The three dimensional resistive memory architecture (100) includes a substrate (105), support circuitry (110) formed on the substrate, and a resistive crossbar memory array (115) constructed over the support circuitry. Over the crossbar memory array a number of overlying traces (120) can be formed. These overlying traces may be used to supply power and/or control signals to the various memory arrays in the data storage device.

In this example, the crossbar memory array (115) includes five metal layers (CM1, RM2, CM3, RM4, CM5). These metal layers form traces and crossbars within the memory array. In this example, metal layers CM1, CM3 and CM5 form column crossbars (125) that run from left to right in the diagram. Metal layers RM2 and RM4 form row crossbars (135) that are directed into/out of the page. In general, each row crossbar crosses over each column crossbar. At each cross point, a memory element (130) is interposed between the column crossbar (125) and the row crossbar (135). The memory elements are in planes p1, p2, p3, and p4. In one example, the memory elements may be nonvolatile resistive memory such as memristor devices. The memory element may have a variety of configurations, including configurations that include a volatile switch with a very high ON/OFF ratio and a nonvolatile switch for storing data.

The support circuitry (110) provides addressing that allows specific row and column crossbars to be selected and the appropriate voltage biases applied to the selected row and column crossbars. To access a memory element, the row crossbar and column crossbar that sandwich the target memory element are selected. Depending on the voltages applied to the crossbars and connections that are made in the support circuitry, the target memory element can then be selectively written with now/data or read to retrieve data that was previously written in the target memory element.

The memory elements in the memory array share crossbars, with one memory element contacting a top of a crossbar and a different memory element contacting the bottom of the crossbar. For example, in FIG. 1A the memory elements (130) in the p4 plane share the row crossbars (135) in metal layer RM4 with the memory elements (138) in the p3 plane. The memory elements (130) in the p4 plane contact the top of the crossbars (125) and the bottom crossbars (135) and memory elements (138) in the p3 plane contact the bottom of the crossbars (125) and the top crossbars (135). To address the memory elements in plane p4, the column crossbars in metal layer CM5 and the row crossbars in metal layer RM4 are used. To address memory elements in the p3 plane the row crossbars RM4 and the column crossbars CM3 are used. For example, to read the memory element (130) in the p4 plane, a read voltage may be placed on the column crossbar (125) and the row crossbar (135) may be grounded or vice versa. This creates the desired read voltage bias across the memory element. The current flowing through the memory element can then be measured to determine if the memory element is in a high resistance OFF state (a digital 0) or a low resistance ON state (a digital 1). This allows data stored in the memory elements to be retrieved. Similarly, the state of the memory elements can be changed by applying the appropriate write voltages across the target memory elements.

FIG. 1A shows a stack (132) of crossbars and memory layers that is replicated and enlarged in FIG. 1B. In FIG. 1B, the memory elements in the stack (132) are illustrated as having directionality. The memory elements may not have perfectly symmetrical behavior. FIG. 1C shows asymmetric I-V characteristics for a memristor memory element embedded in a 4 plane memory. The curves in FIG. 1C show the current that flows through the device as a function of the memory element's state and as a function of the applied voltage. The upper curve in the first quadrant represents the "ON" or low resistance behavior of the memory element to increasing voltages. At a write voltage (+Vw) the behavior abruptly changes because the device switches from an ON state to a high resistance OFF state. The behavior of the memory element in its OFF state is represented by the lower curve. To easily distinguish the state of the memory element it is desirable for the difference between the ON state and the OFF state at a reading voltage (+VSA) to be fairly large. The reading voltage is lower than the writing voltage to avoid unintended changes the state of the device during read operations. In one example, the read voltage may be one half of the maximum write voltage.

As can be seen from Fig, 1C, it is easier to read the state of the memory element in the first quadrant than the third quadrant because there is a greater difference between the ON state and OFF state of the device at the positive read voltage +VSA than at the negative read voltage −VSA. FIG. 1C illustrates that an ON/OFF current ratio is higher for the +VSA voltage bias than for the −VSA voltage bias. For example, if the ON current level at +VSA is arbitrarily assigned a value of 10, the ON/OFF current ratio for the +VSA voltage is greater than 10:1 but the ON/OFF current ratio at −VSA is less than 2:1. The greater the ON/OFF current ratio, the easier it is to determine the state of the memory element and the more immune to noise the system becomes. Thus, there is a preferred current direction through the asymmetric resistive memory elements that results in a greater signal to noise ratio and greater ON/OFF current ratio than the opposite current direction.

Further, the positive write voltage +Vw has a greater magnitude than the negative write voltage −Vw. This allows for greater latitude in selecting a reading voltage that is less than the write voltage. For example, memory elements in a plane or memory array may exhibit a range of characteristics. If one read voltage is used to read the entire plane or array, the read voltage must be less than the lowest write voltage of any memory element. By choosing to read the asymmetric memory element in the first quadrant, it is less likely that the read voltage will disturb the state of any of the memory elements.

Thus, it can be advantageous to apply the read voltage so that current flows through the memory elements in a specific direction. FIG. 1B shows arrows superimposed on the memory elements to illustrate this directionality. To produce current flow in the desired direction and to operate in the first quadrant, the voltages applied to the row and column crossbars can be swapped for each memory plane.

In the following example, the conventional electric current convention is used, with electrical currents flowing from higher positive voltage to lower or negative voltage. This is illustrated by returning to FIG. 1B. If a positive read voltage is applied to RM4 and CM5 is grounded, the memory element in the p4 layer is selected and current flows through it in the direction indicated. To read the memory element in layer p3 with current flow in the desired direction, RM4 should be grounded and the positive read voltage is applied to CM3. Thus, to read the memory element in p4 the positive read voltage is applied RM4, but to read the memory element in p3 RM4 is grounded. Thus the polarity of a voltage bias applied to the crossbars can be dependent on the location of the memory element in the multi-plane memory array.

This switching function as well as addressing is performed by support circuitry (110, FIG. 1A) beneath the memory array (115). FIG. 2 shows how the memory array connects to the underlying circuitry. The center element is the memory array (115) which includes four planes of memory elements. The memory array has a number of contacts that are placed around its perimeter and are connected to the row and column crossbars to address the various memory plane. These contacts are also connected to vias extending upward from the underlying support circuitry.

The upper linear array of contacts connects to column crossbars CM3 between memory planes 2 and 3. The column crossbars CM3 are used to address the memory in planes 2 and 3, but the voltage applied to the column crossbars is dependent on whether the target memory element is above or below the row.

On the left of the memory block (115) is a linear array of contacts that connect to row crossbars RM2 that address planes 1 and 2. On the right of the memory block (115) is a linear array of contacts that connect to row crossbars RM4 that address planes 3 and 4. On the bottom of the memory block (115) is a linear array of contacts that connect to column crossbars CM1 and CM5 that are used to address planes p1 and p4. In FIG. 1A, note that column crossbars CM1 and CM5 are connected by a via just to the left of the memory planes. Address bits DR[4] and DC[4] determine which linear array of memory contacts are selected and hence which plane is connected to the read and write circuits. These address bits are discussed below with reference to FIG. 3.

In order to read all of these memory elements with the current flowing through them in the desired direction, the voltages applied to all of these crossbars is dependent on the location of the target memory element (above or below the crossbar). This information is summarized in the table below for an asymmetric four plane memory block.

TABLE 1

Asymmetric Four Plane Memory Block

| Plane Number | Polarity pos | Polarity neg | Read AR bias | Read AC Bias | Write-1 AR bias | Write-1 AC Bias | Write-0 AR bias | Write-0 AC bias | Unsel Array Bias |
|---|---|---|---|---|---|---|---|---|---|
| 1 | CM15 | RM2 | VSA | gnd | VW+ | gnd | gnd | VW− | VA |
| 2 | RM2 | CM3 | gnd | VSA | gnd | VW+ | VW− | gnd | VA |
| 3 | CM3 | RM4 | VSA | gnd | VW+ | gnd | gnd | VW− | VA |
| 4 | RM4 | CM15 | gnd | VSA | gnd | VW+ | VW− | gnd | VA |

For example, to read memory elements in plane 1, a positive voltage is applied to column crossbars CM1 and CM5 and a negative voltage is applied to the row crossbars RM2. This results in current flowing upward through the memory elements in plane 1. The read voltage applied to the rows is "VSA" which represents the voltage generated by the sense amplifier. The column crossbars are grounded, To write a digital 1 (Write-1) in the memory elements in plane 1, a positive write voltage (VW+) is applied to the rows (AR bias) and a ground voltage (gnd) is applied to the column crossbars (AC bias). This changes the state of the memory elements to a low resistance conducting ON state that represents a digital 1.

Similarly, to write a digital 0 (Write-0) in the memory elements in plane 1, a Write-0 voltage (VW−) is applied to the columns (AC bias) and a ground voltage (gnd) is applied to the row crossbars (AR bias). In one example, the term "VW−" is a notation to indicate a Write-0 and "VW+" is a notation to indicate a Write-1. The process of changing the polarity of the currents through the memory element by swapping voltages on the rows and columns effectively applies a "negative" voltage to the memory element. However, the VW− may still be a positive voltage. Application of the VW− changes the state of the memory elements to a high resistance OFF state that represents a digital 0. The various polarities and voltages for the other three memory planes are presented similarly, The last column of the table shows that there is no change in the unselected array bias (VA) between planes. This is because of the assumption that there were no significant differences between the characteristics of the memory elements in the various planes. However, this may not always be the case. For example, memory elements lower in the stack will have different process history than elements higher in the stack. Additionally, there may be process or material variations that also affect the I-V characteristics of the memory elements. In these circumstances, different voltages may be applied to each layer.

Table 2 is an analog truth table for reading and writing plane dependent, asymmetric memory elements with shared row and column conductors.

Table 2 adds process history to the analog truth table by assigning a plane dependent value to the analog biases. The analog biases need to be supplied to the plane select multiplexer circuit and could come from either external power supplies or be created using on chip circuits. For example, a different positive write voltage and negative write voltage may be applied to every plane. Further, the unselected array bias, which influences the read voltage, may be different for every plane.

Figure 3:
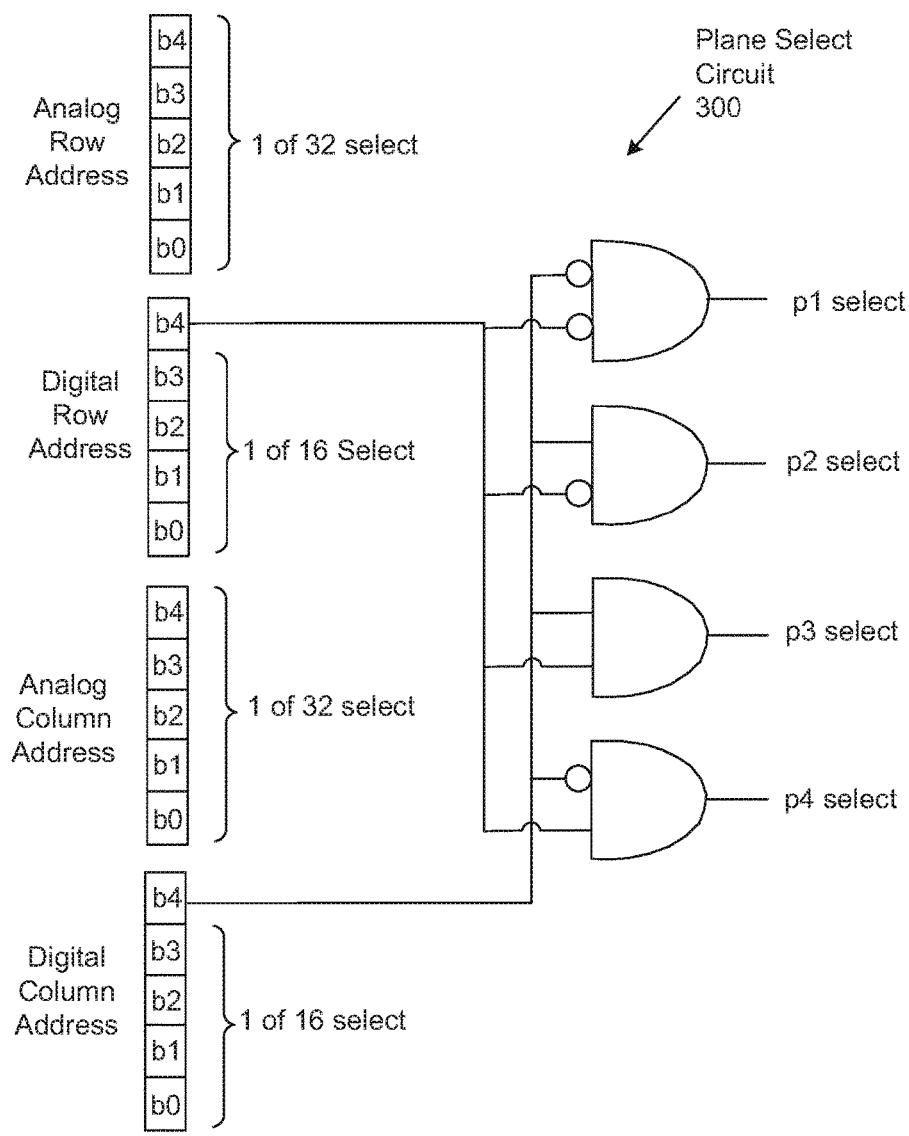
FIG. 3 is a diagram of a four dimensional address for a target memory element and a plane select circuit decoding a portion of the address to sense which plane the target memory element is in, according to one example of principles described herein.

FIG. 3 illustrates a plane select module that is use to determine a plane select address from the incoming address. For this example, a four dimensional address is being used to select memristor devices in the four plane memory stack. The location of the selected rows and columns are specified with address bits "b4" in the digital row address and the digital column address. A short hand notation for these bits is DR[4] and DC[4]. The states of bits DR[4] and DC[4] are fed into the four AND gates. Various inputs to the AND gates have been inverted (represented by circles) to achieve the desired logic. The output of the AND gates is a plane select signal (one of p1 select, p2 select, p3 select or p4 select).

Figure 4:
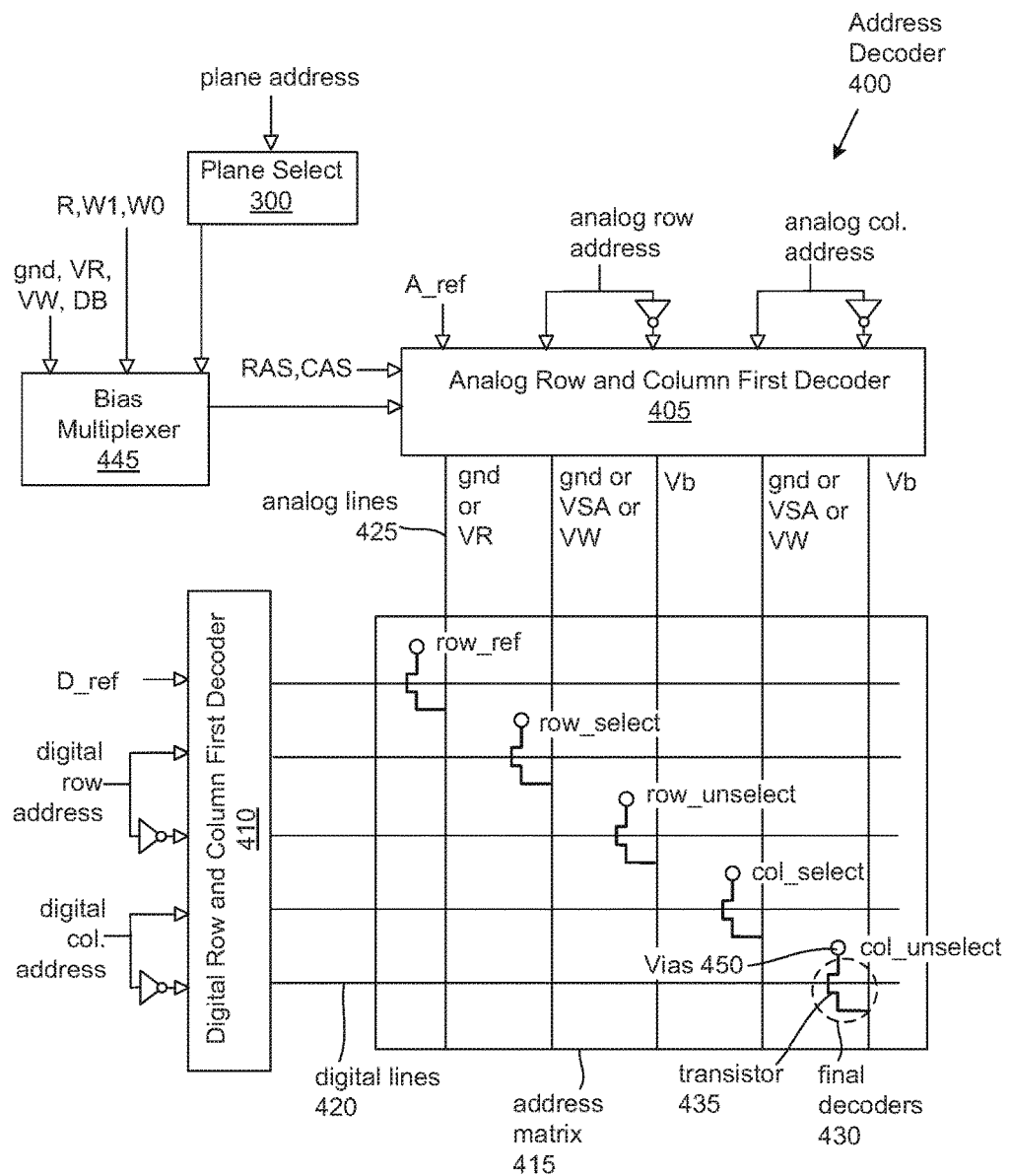
FIG. 4 is a schematic diagram of support circuitry that includes an address decoder, bias multiplexer and a plane select circuit, according to one example of principles described herein.

FIG. 4 gives an overall view of one example of support circuitry that includes an address circuit that can be used to address target memory elements in a multi-plane memory array. The plane select circuit (300) is described above and illustrated in FIG. 3. The plane select circuit (300) accepts a plane address DC[4], DR[4] and outputs the selected plane to the bias multiplexer (445). The bias multiplexer (445) also receives READ/WRITE signals R, W1 and W0 that communicate which mode the memory array tile is to operate in: read (R), write to a low ON resistance (W1), or write to a high OFF resistance (W0). Additionally, the bias multiplexer receives a number of analog lines/signals including: data bus line(s) (DB), a read voltage (VR), a write voltage to write a target memory element to a first state (W1), and a write voltage to write a target memory element to a second state (W0).

The logic within the bias multiplexer (445) uses these inputs to generate the desired analog voltages that will be applied by the analog row and column first decoder (405) to the row and column designated by the analog row address

TABLE 2

Asymmetric and Process Dependent Four Plane Memory Block

| Plane Number | Polarity pos | Polarity neg | Read AR bias | Read AC Bias | Write-1 AR bias | Write-1 AC bias | Write-0 AR bias | Write-0 AC bias | Unsel Array-Bias |
|---|---|---|---|---|---|---|---|---|---|
| 1 | CM15 | RM2 | VSA | Gnd | VW + 1 | gnd | gnd | VW − 1 | VA1 |
| 2 | RM2 | CM3 | gnd | VSA | gnd | VW + 2 | VW − 2 | gnd | VA2 |
| 3 | CM3 | RM4 | VSA | Gnd | VW + 3 | Gnd | gnd | VW − 3 | VA3 |
| 4 | RM4 | CM15 | gnd | VSA | gnd | VW + 4 | VW − 4 | gnd | VA4 | and analog column address. The circuitry in the bias multiplexer (445) and its operation are described below with respect to FIG. 5.

The digital row and column first decoder (410) accepts the digital portions of the address and selects two digital lines (420) and places a voltage on them. The digital lines are connected to the final decoders (430). The final decoders include a transistor (435) with a gate, a source and a drain. The digital lines are connected to the gate to control the conductance between source and the drain. The analog row and column first decoder (405) is connected to a number of analog lines. These analog lines are connected to the source terminal of the final decoders. The drain terminal of the transistors is connected to vias that are routed to connect with the linear arrays of contact shown in FIG. 2.

The digital lines that are selected activate the transistors and connect the analog lines to the vias. The appropriate voltages received from the bias multiplexer are applied to the analog lines by the analog row and column first decoder (405). The analog decoder (405) is configured to accept the analog row and column addresses and to select which voltage/connection is applied to each of the analog lines. For example, the selected analog row line may be connected to ground (gnd), a write voltage (Vw) or a read voltage (VSA). The bias multiplexer selects which of these voltages will be present based on an operational state (read, write) of the memory array. A bias voltage (Vb) is applied to unselected analog lines (425). In one example, a bias voltage is applied to the half selected analog lines that is equal to the read voltage which is equal to one half of the write voltage (Vb=VSA=Vw/2).

The same conventions are used for the column addressing with the selected lines can be connected to ground ("gnd"), have a read voltage applied (VR) or have a write voltage applied (VW). The unselected crossbars have a bias voltage Vb applied. The application of a bias voltage to at least some of the unselected lines reduces the amount of sneak currents in the memory array.

Figure 5:
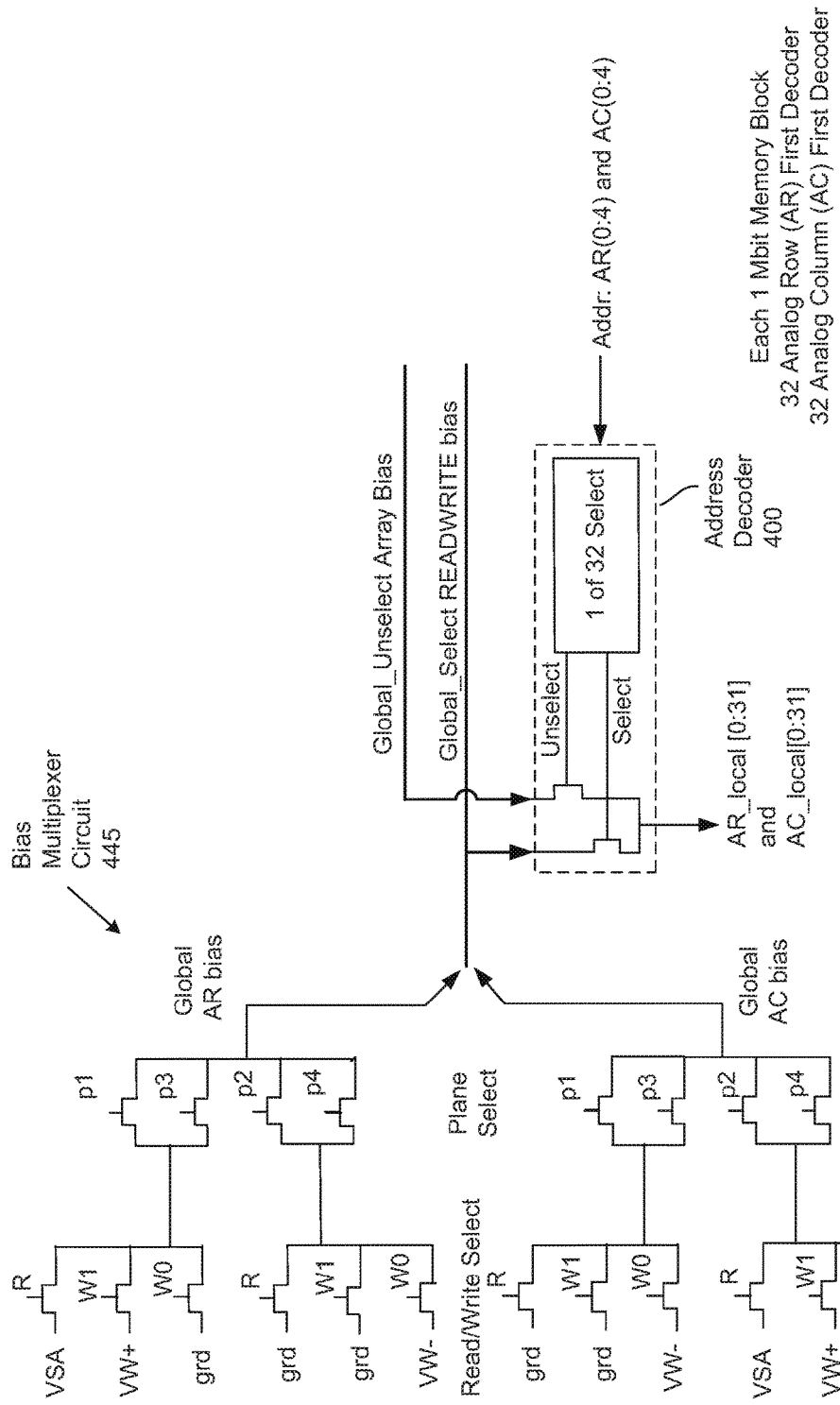
FIG. 5 is a schematic diagram of a bias multiplexer circuit and address decoder, according to one example of principles described herein.

FIG. 5 describes an illustrative bias multiplexer circuit (445) that implements the logic given above in Table 1. As discussed above, the bias multiplexer accepts the operation signals (R, W1, W0) that communicate which mode the device is operating in. Multiplexer also receives the lines with specific functions or voltages. These lines include the data bus lines DB from the sense amplifier carrying the voltage (VSA) from the sense amplifier, the Write-1 voltage (VW+), a Write-0 voltage (VW−), and a ground line (gnd). These lines are input, in various orders into a column of 12 transistors that form the read/write select portion of the circuit. The gates of the transistors are controlled by the operation signals (R, W1, W0).

The output of the read/write select portion (four lines) is accepted by the plane select portion which includes 8 transistors that are controlled by the plane signals (p1, p2, p3, p4) output by the plane select circuitry (300, FIGS. 3 and 4). Two signals are output from the plane portion, the global AR bias (the voltage/connection made to the selected row crossbar) and the global AC bias (the voltage/connection made to the selected column crossbar). The global AR bias and global AC bias are accepted by the global_select READ-WRITE bias bus.

The following example illustrates the operation of the bias multiplexer circuit. For convenience, the transistors in the read/write select and plane select portions will be describe from the top of the page, with the upper most transistor being the first transistor and the transistor below as the second transistor and so forth.

Assume that a read operation is to be performed on a memory element in plane 1. In this case, the R operation signal and p1 plane signal will be high, with the rest of the control signals being low (W1, W0, p2, p3, p4). The R operation signal and p1 plane signal place all the transistors that they are connected to into a conductive state. The first transistor in the read/write select portion is conductive and the first transistor in the plane select portion is conductive. This connects the global AR bias to the sense amplifier data and receives the voltage output from the sense amplifier (VSA). Thus, a signal of VSA is applied to the selected row crossbar.

For the global AC bias, the seventh transistor from the top in the read/write select portion is conductive and the fifth transistor in the plane select portion is conductive. This connects the global AC bias to a ground line (gnd). Referring to Table 1 above this is the correct output for reading memory elements in plane 1.

To read plane 2, the polarity of the AR bias and the AC bias should be reversed no that the current flows through memory elements in plane 2 in the same direction as plane 1. To read plane 2, the high control signals are p2 and R. This closes the fourth transistor in the read/write select portion and the third transistor in the plane select portion to connect the global AR bias to ground. The control signals also close the tenth transistor in the read/write select portion and the seventh transistor in the plane select portion. This connects the global AC bias to the data bus line from the sense amplifier with the voltage VSA. Thus, the logic in the multiplexer has reversed the polarity of the signals for reading plane 2. Referring to Table 1 above this is the correct output for reading memory elements in plane 2.

The global AR bias and the global AC bias are carried by the global_select READWRITE bias bus to the address decoder (400) which include an analog row and column first decoder and its associated final decoders. The first/final decoders accept the analog row address AR(0:4) and the analog column address AC(0:4). Using these addresses the first/final decoders connect the indicated global AR bias to the indicated row crossbar and the indicated global AC bias to the indicated column crossbar. More detail about this process is given above with respect to FIG. 4.

Thus, a system for generating and applying a geometry dependent voltage bias to an asymmetric resistive memory may include a multi-plane memory array with shared crossbars and memory elements accessed through the shared crossbars. Support circuitry for the multi-plane memory array may include a bias multiplexer to determine an orientation of a target memory element in the multi-plane memory array and output voltage biases with a polarity based on the orientation of the target memory element.

The system may also include a plane select circuit to accept an address of the target memory element and determine which plane within the multi-plane memory array the target memory element is located. The output of the plane select circuit identifies the plane in which the target memory element resides. This output is communicated to the bias multiplexer.

The bias multiplexer includes transistors with gates connected control signals defining an operating state of the multi-plane memory array and to control signals that define a plane of the target memory element. The transistors accept read, write and ground inputs and alter a polarity of the voltage biases generated using the read, write and ground inputs according to the plane of the target memory element. The read, write and ground inputs are shown entering from the left in FIG. 5 and the voltage biases (global AR bias, global AC bias) are shown exiting from the transistors to the right. The system may also include a decoder such as the first decoders (405, 410; FIG. 4) and final decoders (430; FIG. 4) in the address matrix (415; FIG. 4) shown in FIG. 4. The decoder accepts an address of the target memory element and applies the voltage biases to a row crossbar and a column crossbar connected to the target memory element.

Figure 6:
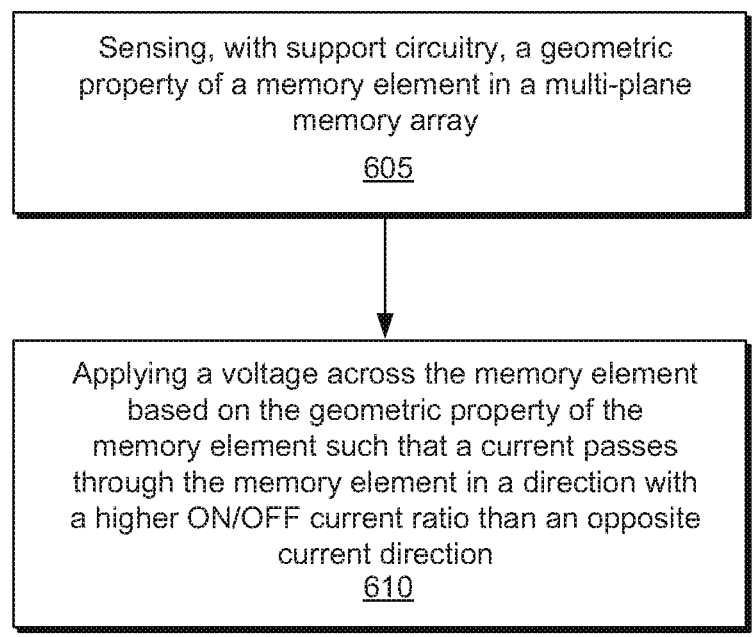
FIG. 6 is a flow chart of a method for generating and applying geometrically dependent voltage biases to asymmetric resistive memories, according to one example of principles described herein.

FIG. 6 is a flow chart of a method (600) that includes sensing, with support circuitry, a geometric property of an asymmetric resistive memory element in a multi-plane memory array (block 605). For example, the geometric property may be a location of the memory element within the multi-plane memory array. The location of the memory element could be defined by an address that specifies which plane the memory element is located within and/or which crossbars or crossbar layers the memory element is accessed with. Sensing the geometric property may include identifying an orientation of the memory element. For example, the polarity or direction of an asymmetric aspect or behavior of the memory element could be determined. Sensing the geometric property of the memory element may be performed in a variety of ways including using a binary address of the memory element. For example, a binary address of the memory element in the multi-plane memory array may be input into a plane select circuit. The output of the plane select circuit identifies which plane in the multi-plane memory the memory element is in.

The method also includes applying a voltage bias across the memory element based on the geometric property of the memory element such that a current passes through the memory element in a direction with a higher ON/OFF current ratio than an opposite current direction (block 610). For example, applying a voltage bias across the memory element may include determining a polarity of the voltage bias to be applied across the memory element based on the geometric property of the memory element. The application of the voltage bias may be made up of two different voltages, with a first voltage applied to a crossbar above the memory element and a different second voltage to a crossbar below the memory element.

In one example, the multi-plane memory array includes shared crossbars that address memory elements in a plane above the shared crossbars and memory elements in a plane below the shared crossbars. For the same read operation, the polarity of the voltage bias is reversed depending on whether the target memory element is below or above the shared crossbar. For example, a first voltage is applied to a shared crossbar when the memory element connected to an upper surface of the shared crossbar is read and a second different voltage is applied to the shared crossbar when second memory element connected to a lower surface of the shared crossbar is read. In some implementations this allows for a flow of current through all memory elements in the multi-plane memory array to be in a same direction and in the direction where the ON/OFF current ratio is the highest. As discussed above, FIGS. 1B and 1C illustrate that an ON/OFF current ratio is higher for the +VSA voltage bias than for the −VSA voltage bias. For example, if the ON current level at +VSA is arbitrarily assigned a value of 10, the ON/OFF current ratio for the +VSA voltage is greater than 10:1 but the ON/OFF current ratio at −VSA is less than 2:1. The greater the ON/OFF current ratio, the easier it is to determine the state of the memory element and the more immune to noise the system becomes.

Additionally, there may be different voltage biases applied to different planes in the multi-plane memory array to compensate for process and material variations between the different planes. These voltage biases could be applied using logic gates similar to those shown in FIG. 5, but with the different voltage biases for the specific memory planes supplied as inputs. The plane inputs (p1, p2, p3, p4) can then be used to select the desired voltage bias for the specific plane, Thus, a method for applying a voltage biases to bipolar (asymmetric) resistive memory elements can include sensing a three dimensional location and orientation of a bipolar resistive memory element in a multi-plane memory array by decoding a four dimensional address of the memory element. The polarity of the voltage bias to be applied to the memory element is determined by a logic circuit (for example the circuits shown in FIGS. 3 and 5) based on the three dimensional location and orientation of the memory element with the multi-plane memory array.

The principles described above account for the asymmetric characteristics of memristor devices and implement logic to ensure that the memory elements are read in an optimal way. To do this, the systems and methods detect at least one geometric aspect of an asymmetric resistive memory such as: the location (plane) or orientation (polarity) of a memory element in a multi-plane memory array. The appropriate analog biases are then applied to achieve optimum read and write performance. In some implementations, the systems and methods also account for the process history and different characteristics between memory planes in the memory array.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A system comprising:
   a multi-plane memory array with shared crossbars and memory elements accessed through the shared crossbars;
   support circuitry comprising a bias multiplexer to determine an orientation of a target memory element in the multi-plane memory array and output voltage biases with a polarity based on the orientation of the target memory element.

2. The system of claim 1, further comprising a plane select circuit to accept an address of the target memory element and determine which plane within the multi-plane memory array the target memory element is located and to communicate the determined plane to the bias multiplexer, wherein a voltage applied to the target memory element is determined based on in which plane of the multi-plane memory array the target memory element is located.

3. The system of claim 2, in which the bias multiplexer comprises transistors with gates connected to control signals defining an operating state of the multi-plane memory array and defining a plane of the target memory element, in which the transistors are to accept read, write and ground inputs and to alter a polarity of the voltage biases generated using the read, write, and ground inputs according to the plane of the target memory element.

4. The system of claim 1, further comprising a decoder to accept an address of the target memory element and apply the voltage biases to a row crossbar and a column crossbar connected to the target memory element.

5. A method comprising:
   sensing, with a bias multiplexer, a geometric property of an asymmetric resistive memory element in a multi-plane memory array with shared crossbars and memory elements accessed through the shared crossbars; and
   applying a voltage bias across the memory element based on the geometric property of the memory element such that a current passes through the memory element in a direction with a higher ON/OFF current ratio than an opposite current direction.

6. The method of claim 5, in which applying a voltage bias across the memory element comprises determining a polarity of the voltage bias to be applied across the memory element based on the geometric property of the memory element.

7. The method of claim 5, in which the multi-plane memory array comprises shared crossbars, in which the shared crossbars address memory elements in a plane above the shared crossbars and memory elements in a plane below the shared crossbars, in which a first voltage is applied to a shared crossbar when the memory element connected to an upper surface of the shared crossbar is read or written and a second different voltage is applied to the shared crossbar when a second memory element connected to a lower surface of the shared crossbar is read or written.

8. The method of claim 5, in which sensing a geometric property comprises detecting a location of the memory element within the multi-plane memory array.

9. The method of claim 8, in which detecting a location of the memory element comprises identification of in which memory plane within the multi-plane memory array the memory element is located.

10. The method of claim 5, in which applying a voltage bias across the memory element comprises applying a first voltage to a crossbar above the memory element and a different second voltage to a crossbar below the memory element.

11. The method of claim 5, in which a flow of current through all memory elements in the multi-plane memory array is in a same direction.

12. The method of claim 5, further comprising applying a different voltage bias to memory elements residing in different planes of the multi-plane memory array to compensate for manufacturing process and material variations between the different planes.

13. The method of claim 5, in which the geometric property comprises identifying an orientation of the memory element.

14. The method of claim 5, in which sensing a geometric property of the memory element comprises accepting a binary address of the memory element in the multi-plane memory array and inputting the binary address into a plane select circuit.

15. The method of claim 5, wherein sensing the geometric property of the memory element comprises sensing a three dimensional location and orientation of the resistive memory element in a multi-plane memory array by decoding a four dimensional address of the resistive memory element;
the method further comprising determining, with a logic circuit, a polarity of a voltage bias to be applied to the resistive memory element based on the three dimensional location and orientation of the bipolar resistive memory element.

16. The method of claim 5, further comprising applying a different voltage bias based on in which plane of the multi-plane memory array the memory element is located.

17. A system comprising:
a multi-plane memory array in which each of a plurality of stacked planes contains an array of memory elements, wherein crossbars are shared between adjacent planes of the multi-plane memory and individual memory elements accessed through the shared crossbars; and
support circuitry comprising a bias multiplexer to determine an orientation of a target memory element in the multi-plane memory array as above or below a corresponding word line of the shared crossbars used to access that target memory element, the support circuitry to output a voltage bias to the target memory element with a polarity that is based on the orientation of the target memory element.

18. The system of claim 17, further comprising a plane select circuit to determine in which plane of the multi-plane memory array the target memory element is located, wherein the support circuitry is to apply different voltages to different planes of the multi-plane memory array.

19. The system of claim 18, the plane select circuit to accept an address of the target memory element and determine in which plane within the multi-plane memory array the target memory element is located based on the address.

20. The system of claim 19, the plane select circuit comprises a plurality of AND gates to output a signal indicating the plane of the target memory element based on the address.

* * * * *